(12) United States Patent
Pak et al.

(10) Patent No.: US 11,205,614 B2
(45) Date of Patent: Dec. 21, 2021

(54) STACK PACKAGES (71) Applicant: Samsung Electronics Co., Ltd., Suwon-si (KR)

(72) Inventors: Jun So Pak, Seongnam-si (KR); Seungki Nam, Seongnam-si (KR); Jiyoung Park, Hwaseong-si (KR); Bo Pu, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 16/863,257

(22) Filed: Apr. 30, 2020

(65) Prior Publication Data
US 2021/0028100 A1 Jan. 28, 2021

(30) Foreign Application Priority Data

Jul. 22, 2019 (KR) .................. 10-2019-0088474
Mar. 4, 2020 (KR) .................. 10-2020-0026921

(51) Int. Cl.
*H01L 23/498* (2006.01)
*H01L 23/00* (2006.01)
*H01L 23/31* (2006.01)
*H01L 21/48* (2006.01)
*H01L 21/56* (2006.01)

(52) U.S. Cl.
CPC ...... *H01L 23/49833* (2013.01); *H01L 21/486* (2013.01); *H01L 21/4853* (2013.01); *H01L 21/565* (2013.01); *H01L 23/3128* (2013.01); *H01L 23/49827* (2013.01); *H01L 23/49838* (2013.01); *H01L 24/16* (2013.01); *H01L 2224/16227* (2013.01)

(58) Field of Classification Search
CPC ...................................... H01L 21/486
See application file for complete search history.

(56) References Cited

U.S. PATENT DOCUMENTS

| | | | |
|---|---|---|---|
| 9,165,877 B2 | 10/2015 | Chen et al. | |
| 9,190,401 B2 | 11/2015 | Yim et al. | |
| 9,196,586 B2 | 11/2015 | Chen et al. | |
| 9,337,138 B1 | 5/2016 | Abugharbieh et al. | |
| 9,570,399 B2 | 2/2017 | Yang et al. | |
| 9,812,429 B2 | 11/2017 | Das et al. | |
| 2009/0008792 A1* | 1/2009 | Ko | H01L 23/5389 257/774 |
| 2019/0123109 A1 | 4/2019 | Xie et al. | |

* cited by examiner

*Primary Examiner* — William A Harriston
(74) *Attorney, Agent, or Firm* — Harness, Dickey & Pierce, P.L.C.

(57) ABSTRACT

A stack package may include a first substrate package, a second substrate package, an interposer and at least one semiconductor chip. The first substrate package may include a plurality of first pads isolated from direct contact with each other by a first pitch. The second substrate package may be under the first substrate package. The second substrate package may include a plurality of second pads isolated from direct contact with each other by a second pitch. The second pitch may be different from the first pitch. The interposer may be above the first substrate package. The interposer may include a plurality of third pads isolated from direct contact with each other by a third pitch. The semiconductor chip may be arranged above the interposer.

20 Claims, 11 Drawing Sheets

STACK PACKAGES

CROSS-RELATED APPLICATIONS

This application claims priority under 35 USC § 119 to both Korean Patent Application No. 10-2019-0088474, filed on Jul. 22, 2019 in the Korean Intellectual Property Office (KIPO), and Korean Patent Application No. 10-2020-0026921, filed on Mar. 4, 2020 in the Korean Intellectual Property Office (KIPO), the contents of each of which are herein incorporated by reference in their entirety.

BACKGROUND

1. Field

Example embodiments relate to semiconductor packages and methods of manufacturing the same. More particularly, example embodiments relate to stack packages including an interposer and methods of manufacturing the stack packages.

2. Description of the Related Art

Generally, when substrate packages including pads, which may have different pitches, may be stacked, an interposer may be used. The interposer may be interposed between the substrate packages to electrically connect the pads of the substrate packages with each other.

According to related arts, the interposer may be applied to any one of the substrate packages, for example, any one of an Ajinomoto build-up film (ABF) package and a high density interconnection (HDI) package. When the interposer may be applied to the ABF package, a high cost may be invested for manufacturing a stack package having a large area. When the interposer may be applied to the HDI package, the interposer may include a horizontal signal line configured to connect the pads of the interposer with each other for corresponding to a fine pitch of the interposer. The horizontal signal line may increase a resistance to deteriorate a performance of the stack package.

SUMMARY

Some example embodiments provide a stack package having improved performance using a low cost.

Some example embodiments also provide a method of manufacturing the above-mentioned stack package.

According to some example embodiments, a stack package may include a first substrate package, a second substrate package, an interposer and at least one semiconductor chip. The first substrate package may include a plurality of first pads isolated from direct contact with each other by a first pitch. The second substrate package may be under the first substrate package. The second substrate package may include a plurality of second pads isolated from direct contact with each other by a second pitch. The second pitch may be different from the first pitch. The interposer may be above the first substrate package. The interposer may include a plurality of third pads isolated from direct contact with each other by a third pitch. The semiconductor chip may be arranged above the interposer.

According to some example embodiments, a stack package may include a first substrate package including a plurality of first pads isolated from direct contact with each other by a first pitch. The stack package may include a second substrate package under the first substrate package. The second substrate package may include a plurality of second pads isolated from direct contact with each other by a second pitch. The second pitch may be different from the first pitch. The stack package may include a plurality of first conductive bumps between the first substrate package and the second substrate package to electrically connect the plurality of second pads with the first substrate package. The stack package may include an interposer above the first substrate package. The interposer may include a plurality of third pads isolated from direct contact with each other by a third pitch substantially the same as the first pitch, a plurality of fourth pads isolated from direct contact with each other by a fourth pitch, the fourth pitch being narrower than the third pitch, and a plurality of connection lines extended from separate, respective fourth pads of the plurality of fourth pads. The stack package may include a plurality of second conductive bumps between the first substrate package and the interposer to electrically connect the plurality of first pads with the interposer. The stack package may include at least one first semiconductor chip above the interposer and electrically connected to the plurality of third pads and the plurality of connection lines. The stack package may include at least one second semiconductor chip above the interposer and electrically connected to the plurality of fourth pads. The stack package may include a plurality of third conductive bumps between the interposer and the first and second semiconductor chips to electrically connect the interposer with the first and second semiconductor chips.

According to some example embodiments, a stack package may include an Ajinomoto build-up film (ABF) package including a plurality of first pads isolated from direct contact with each other by a first pitch, wherein the first pitch is about 55 µm to about 150 µm. The stack package may include a high density interconnection (HDI) package under the ABF package, the HDI package including a plurality of second pads isolated from direct contact with each other by a second pitch, wherein the second pitch is about 400 µm to about 600 µm, wherein an area of the HDI package is larger than an area of the ABF package. The stack package may include a plurality of first conductive bumps between the ABF package and the HDI package to electrically connect the plurality of second pads with the ABF package. The stack package may include an interposer above the ABF package, the interposer including a plurality of third pads isolated from direct contact with each other by a third pitch, wherein the third pitch is about 55 µm to about 150 µm, the interposer further including a plurality of vertical signal lines downwardly extended from separate, respective third pads of the plurality of third pads, a plurality of fourth pads isolated from direct contact with each other by a fourth pitch, the fourth pitch being less than about 55 µm, the interposer further including a plurality of connection lines extended from separate, respective fourth pads of the plurality of fourth pads, wherein an area of the interposer is smaller than the area of the ABF package. The stack package may include a plurality of second conductive bumps between the ABF package and the interposer to electrically connect the plurality of first pads with the plurality of vertical signal lines. The stack package may include at least one application specific integrated circuit (ASIC) above the interposer and electrically connected to the plurality of third pads and the plurality of connection lines. The stack package may include at least one high bandwidth memory (HBM) above the interposer and electrically connected to the plurality of fourth pads. The stack package may include a plurality of third conductive bumps between the interposer and the ASIC and the HBM to electrically connect the interposer with the ASIC and the HBM. The stack package may include a molding member configured to cover the ABF package, the HDI package, the interposer, the ASIC and the HBM.

According to some example embodiments, a method of manufacturing a stack package may include arranging a first substrate package over a second substrate package. The first substrate package may include a plurality of first pads isolated from direct contact with each other by a first pitch. The second substrate package may include a plurality of second pads isolated from direct contact with each other by a second pitch, the second pitch being different from the first pitch. The method may include arranging an interposer above the first substrate package. The interposer may include a plurality of third pads isolated from direct contact with each other by a third pitch. The method may include arranging at least one first semiconductor chip above the interposer.

According to some example embodiments, the stack package may include the HDI package, the ABF package, the interposer and the ASIC having the different pitches to reduce a cost for manufacturing the stack package having a large area.

Further, the ABF package and the interposer may have the substantially the same pitch. Thus, the ABF package and the interposer may be electrically connected with each other only through the vertical signal line in the interposer. Therefore, it may not be required to form a horizontal signal line in the interposer. As a result, a resistance increase caused by the horizontal signal line may be reduced or prevented so that the stack package may have improved performance.

BRIEF DESCRIPTION OF THE DRAWINGS

Example embodiments will be more clearly understood from the following detailed description taken in conjunction with the accompanying drawings. FIGS. 1 to 20 represent non-limiting, example embodiments as described herein.

DETAILED DESCRIPTION

Hereinafter, some example embodiments will be explained in detail with reference to the accompanying drawings.

Figure 1:
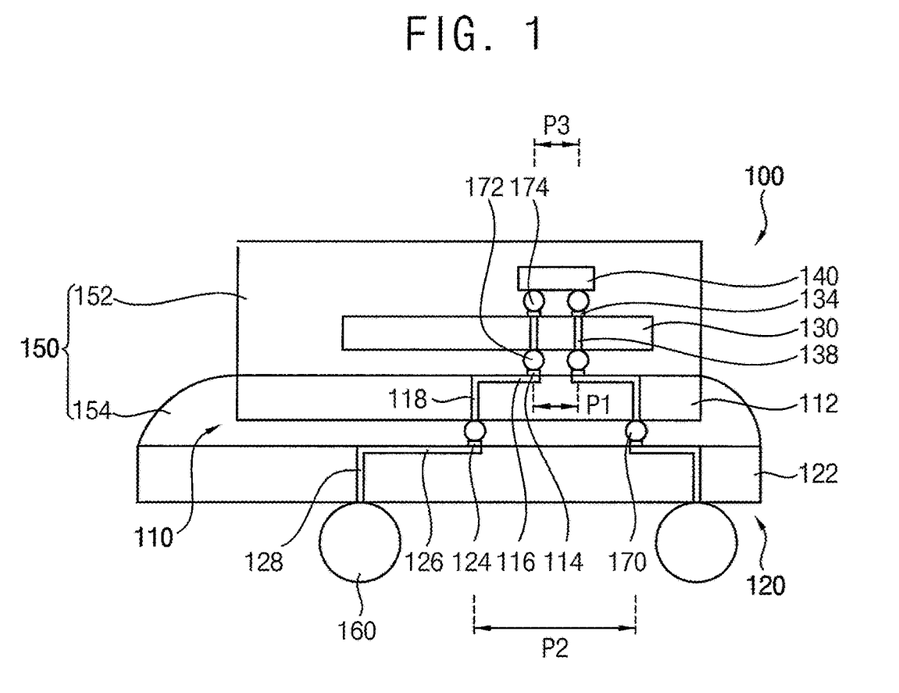
FIG. 1 is a cross-sectional view illustrating a stack package in accordance with example embodiments.
Figure 2:
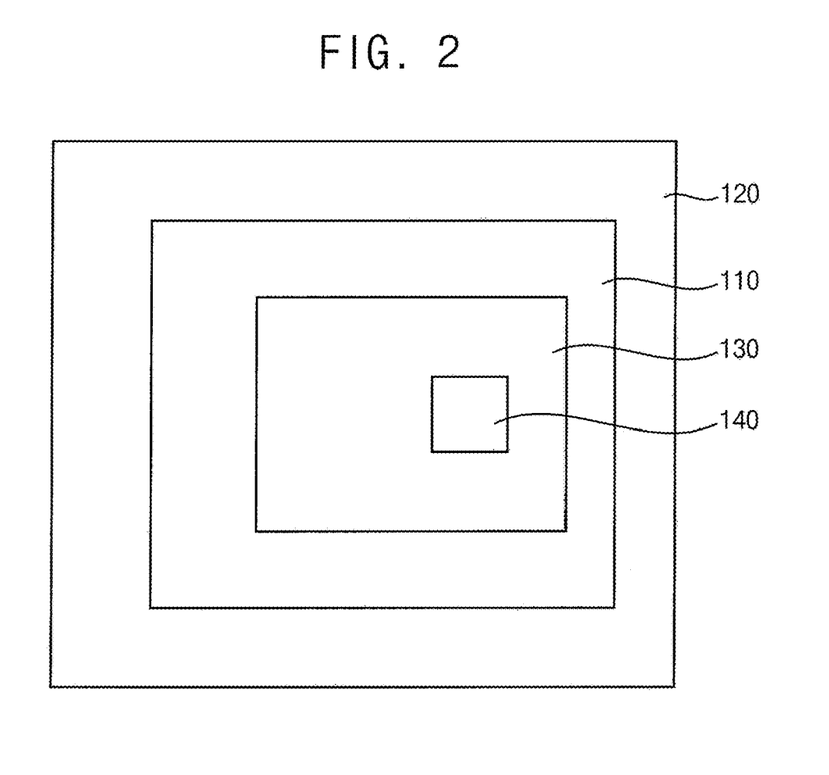
FIG. 2 is a plan view illustrating the stack package in FIG. 1.

FIG. 1 is a cross-sectional view illustrating a stack package in accordance with example embodiments, and FIG. 2 is a plan view illustrating the stack package in FIG. 1.

Referring to FIGS. 1 and 2, a stack package 100 of some example embodiments may include first substrate package 110, a second substrate package 120, an interposer 130, a first semiconductor chip 140, first to third conductive bumps 170, 172 and 174, a molding member 150 and a plurality of external terminals 160.

The second substrate package 120 may be arranged under (e.g., beneath) the first substrate package 110 (e.g., on a lower surface of the first substrate package 110, as shown in at least FIG. 1). The interposer 130 may be arranged over (e.g., above) the first substrate package 110 such that the first substrate package 110 is between the interposer 130 and the second substrate package 120. The first semiconductor chip 140 may be arranged over (e.g., above) the interposer 130 such that the interposer 130 is between the first substrate package 110 and the first semiconductor chip 140. That is, the second substrate package 120, the first substrate package 110, the interposer 130 and the first semiconductor chip may be sequentially stacked.

The first substrate package 110 may have a first area. In some example embodiments, the first area of the first substrate package 110 may be a range from about 30 μm×30 μm to about 50 μm×50 μm. However, the first area of the first substrate package 110 may not be restricted within the above-mentioned range.

The second substrate package 120 may have a second area larger than the first area of the first substrate package 110, such that the first area of the first substrate package 110 is smaller than the second area of the second substrate package 120. In some example embodiments, the second area of the second substrate package 120 may be no less than about 50 μm×50 μm. However, the second area of the second substrate package 120 may not be restricted within the above-mentioned range.

The interposer 130 may have a third area smaller than the first area of the first substrate package 110, such that the first area of the first substrate package 110 is greater (e.g., larger) than the third area of the interposer 130. In some example embodiments, the third area of the interposer 130 may be a range from 20 μm×20 μm to about 50 μm×50 μm. In some example embodiments, the third area of the interposer 130 may be a range from 20 μm×20 μm to about 30 μm×30 μm. However, the third area of the interposer 130 may not be restricted within the above-mentioned ranges.

The first semiconductor chip 140 may have a fourth area smaller than the third area of the interposer 130. In some example embodiments, the fourth area of the first semiconductor chip 140 may be a range from 5 μm×5 μm to about 20 μm×20 μm. However, the fourth area of the first semiconductor chip 140 may not be restricted within the above-mentioned range. The first semiconductor chip 140 may include a logic chip. For example, the first semiconductor chip 140 may include an application specific integrated circuit (ASIC).

Therefore, the stack package 100 including the sequentially stacked second substrate package 120, first substrate package 110, interposer 130 and first semiconductor chip 140 having the gradually decreased areas may have a stepped pyramidal structure.

The plurality of first conductive bumps 170 may be interposed between the second substrate package 120 and the first substrate package 110 to electrically connect the second substrate package 120 with the first substrate package 110. The plurality of second conductive bumps 172 may be interposed between the first substrate package 110 and the interposer 130 to electrically connect the first substrate package 110 with the interposer 130. The plurality of third conductive bumps 174 may be interposed between the interposer 130 and the first semiconductor chip 140 to electrically connect the interposer 130 with the first semiconductor chip 140. In some example embodiments, the second conductive bumps 172 may each have a size of no more than a size of an individual first conductive bump 170 of the first conductive bumps 170. The third conductive bumps 174 may each have a size of no more than the size of an individual second conductive bump 172 of the second conductive bumps 172. The first to third conductive bumps 170, 172 and 174 may include solder.

The molding member 150 may be configured to cover the second substrate package 120, the first substrate package 110, the interposer 130 and the first semiconductor chip 140. The molding member 150 may include a first molding member 152 and a second molding member 154. The first molding member 152 may be configured to cover the first substrate package 110, the interposer 130 and the first semiconductor chip 140. The second molding member 154 may be configured to surround side surfaces of the second substrate package 120. The molding member 150 may include an epoxy molding compound (EMC).

The external terminals 160 may be mounted on a lower surface of the second substrate package 120. The external terminals 160 may include solder.

Figure 3:
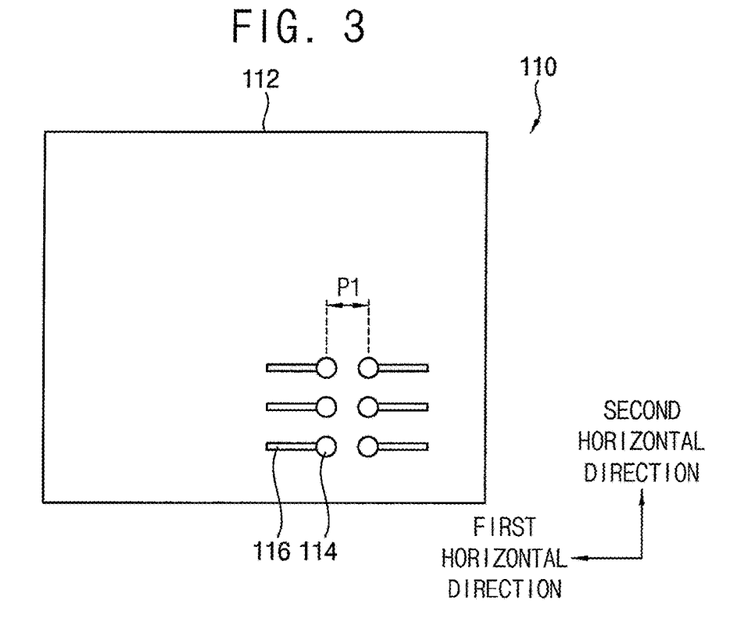
FIG. 3 is a plan view illustrating a first substrate package of the stack package in FIG. 2.

FIG. 3 is a plan view illustrating a first substrate package of the stack package in FIG. 2.

Referring to FIGS. 1 to 3, the first substrate package 110 may include a first insulation substrate 112, a plurality of first pads 114, a plurality of first horizontal signal lines 116 and a plurality of first vertical signal lines 118.

As shown in FIGS. 1 and 3, the first pads 114 may be arranged on an upper surface of the first insulation substrate 112. The first pads 114 may be arranged spaced apart from each other, so as to be isolated from direct contact with each other on the upper surface of the first insulation substrate 112, by a first pitch P1 along a first horizontal direction. A pitch between the first pads 114 along a second horizontal direction substantially perpendicular to the first horizontal direction may be substantially the same as the first pitch P1 of the first pads 114 along the first horizontal direction. The second conductive bumps 172 may be connected to the first pads 114. Thus, the second conductive bumps 172 may also be arranged spaced apart from each other by the first pitch P1 along the first horizontal direction. In some example embodiments, the pitch between the first pads 114 along the second horizontal direction may be different from the first pitch P1 of the first pads 114 along the first horizontal direction.

In some example embodiments, the first pitch P1 may be about 55 μm to about 150 μm. However, the first pitch P1 may not be restricted within the above-mentioned range.

The first horizontal signal lines 116 may be extended from separate, respective first pads 114 on the upper surface of the first insulation substrate 112. The first vertical signal lines 118 may be extended from ends of separate, respective first horizontal signal lines 116 to a lower surface of the first insulation substrate 112 vertically through the first insulation substrate 112. The first vertical signal lines 118 may include lower ends exposed through the lower surface of the first insulation substrate 112. The first conductive bumps 170 may be connected to the exposed lower ends of the first vertical signal lines 118.

In some example embodiments, the first substrate package 110 may include an Ajinomoto build-up film (ABF) package including an ABF. The first pads 114 having the first pitch P1 may be formed on the upper surface of the first insulation substrate 112 using the ABF.

Figure 4:
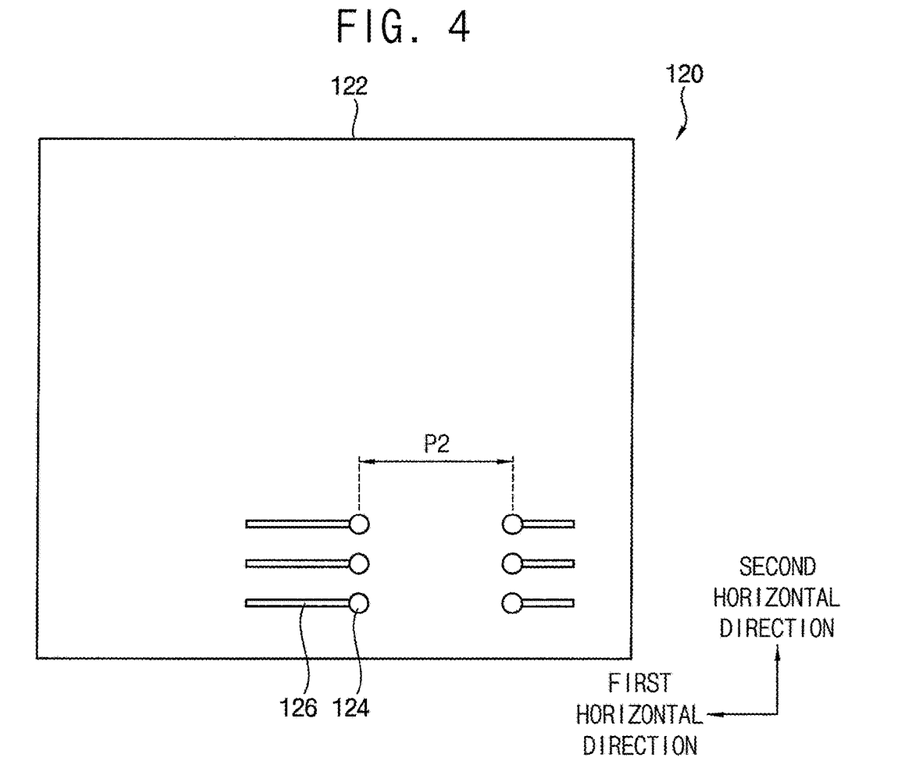
FIG. 4 is a plan view illustrating a second substrate package of the stack package in FIG. 2.

FIG. 4 is a plan view illustrating a second substrate package of the stack package in FIG. 2.

Referring to FIGS. 1, 2 and 4, the second substrate package 120 may include a second insulation substrate 122, a plurality of second pads 124, a plurality of second horizontal signal lines 126 and a plurality of second vertical signal lines 128.

The second pads 124 may be arranged on an upper surface of the second insulation substrate 122. The second pads 124 may be arranged spaced apart from each other, so as to be isolated from direct contact with each other, by a second pitch P2 along the first horizontal direction. A pitch between the second pads 124 along the second horizontal direction may be substantially the same as the second pitch P2 of the second pads 124 along the first horizontal direction. The first conductive bumps 170 may be connected to the second pads 124. Thus, the first conductive bumps 170 may also be arranged spaced apart from each other by the second pitch P2 along the first horizontal direction. The first vertical signal lines 118 of the first substrate package 110 may be electrically connected with the second pads 124 of the second substrate package 120 via the first conductive bumps 170. In some example embodiments, the pitch between the second pads 124 along the second horizontal direction may be different from the second pitch P2 of the second pads 124 along the first horizontal direction.

The second pitch P2 may be different from the first pitch P1. In some example embodiments, the second pitch P2 may be wider (e.g., greater) than the first pitch P1, such that the first pitch P1 is narrower (e.g., smaller) than the second pitch P2. The second pitch P2 may be about 400 μm to about 600 μm. However, the second pitch P2 may not be restricted within the above-mentioned range. In some example embodiments, the second pitch P2 may be narrower than the first pitch P1.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The second horizontal signal lines 126 may be extended from separate, respective second pads 124 on the upper surface of the second insulation substrate 122. The second vertical signal lines 128 may be extended from ends of separate, respective second horizontal signal lines 126 to the lower surface of the second insulation substrate 122 vertically through the second insulation substrate 122. The second vertical signal lines 128 may include lower ends exposed through the lower surface of the second insulation substrate 122. The external terminals 160 may be connected to the exposed lower ends of the second vertical signal lines 128.

In some example embodiments, the second substrate package 120 may include a high density interconnection (HDI) package. The HDI package may include an HDI substrate including a core layer, a prepreg layer and a dielectric layer.

Figure 5:
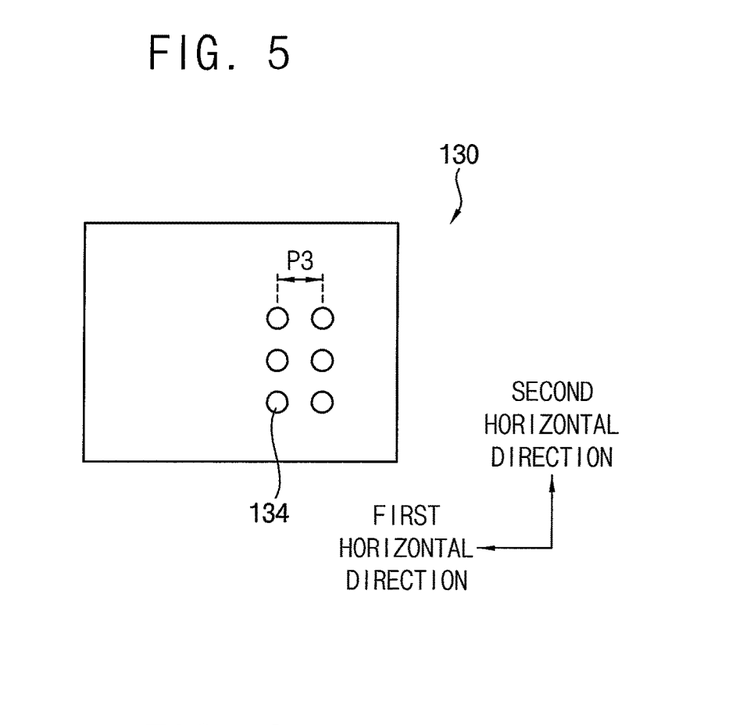
FIG. 5 is a plan view illustrating an interposer of the stack package in FIG. 2.

FIG. 5 is a plan view illustrating an interposer of the stack package in FIG. 2.

Referring to FIGS. 1, 2 and 5, the interposer 130 may include a plurality of third pads 134 and a plurality of third vertical signal lines 138. The interposer 130 of some example embodiments may not include a horizontal signal line. Further, the interposer 130 may include silicon.

The third pads 134 may be arranged on an upper surface of the interposer 130. The third pads 134 may be arranged spaced apart from each other, so as to be isolated from direct contact with each other, by a third pitch P3 along the first horizontal direction. A pitch between the third pads 134 along the second horizontal direction may be substantially the same as the third pitch P3 of the third pads 134 along the first horizontal direction. The third conductive bumps 174 may be connected to the third pads 134. Thus, the third conductive bumps 174 may also be arranged spaced apart from each other by the third pitch P3 along the first horizontal direction. In some example embodiments, the pitch between the third pads 134 along the second horizontal direction may be different from the third pitch P3 of the third pads 134 along the first horizontal direction.

The third pads 134 of the interposer 130 may be electrically connected with the first semiconductor chip 140 via the third conductive bumps 174. In some example embodiments, the third pitch P3 may be substantially the same (e.g., the same within manufacturing tolerances and/or material tolerances) as the first pitch P1. In some example embodiments, the third pitch P3 may be narrower or wider than the first pitch P1. In some example embodiments, the third pitch P3 may be about 55 μm to about 150 μm.

The third vertical signal lines 138 may be extended from ends of separate, respective third pads 134 to a lower surface of the interposer 130 vertically through the interposer 130. The third vertical signal lines 138 may include lower ends exposed through the lower surface of the interposer 130. The second conductive bumps 172 may be connected to the exposed lower ends of the third vertical signal lines 138. Thus, the interposer 130 may be electrically connected with the first substrate package 110 via the second conductive bumps 172.

In some example embodiments, the first substrate package 110 may be interposed between the interposer 130 and the second substrate package 120. Because the first substrate package 110 may include the ABF package including the first pads 114 spaced apart from each other by the first pitch P1, which may be substantially the same as the fine third pitch P3 of the interposer 130, the third pads 134 of the interposer 130 may be electrically connected with the first pads 114 of the first substrate package 110 only through the third vertical signal lines 138. Therefore, it may not be required to form a horizontal signal line, which may generate a high resistance, in the interposer 130. As a result, the stack package 100 of some example embodiments may have improved performance.

Further, the second substrate package 120 and the first substrate package 110 may be electrically connected with the first semiconductor chip 140 via the interposer 130. Thus, the interposer 130 may have the size smaller than the size of the first substrate package 110. Furthermore, because the expensive first substrate package 110 may be interposed between the interposer 130 and the second substrate package 120, it may not be required to provide the first substrate package 110 with a large size. As a result, a cost for manufacturing the stack package 100 having a large size may be reduced.

FIGS. 6, 7, 8, 9, and 10 are cross-sectional views illustrating a method of manufacturing the stack package in FIG. 1. It will be understood that the operations of the method as shown in FIGS. 6-10 may be implemented in a different order than as shown in FIGS. 6-10. For example, the operation(s) shown in FIG. 9 may be implemented prior to operation(s) shown in FIG. 6, in some example embodiments. The methods as described herein may be implemented by any well-known devices for manufacturing stack packages, including any well-known computing devices configured to control such devices for manufacturing one or more stack packages. Such well-known computing devices may include one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to control one or more well-known devices for manufacturing stack packages to implement some or all of any methods for manufacturing one or more stack packages with regard to any example embodiments.

Figure 6:
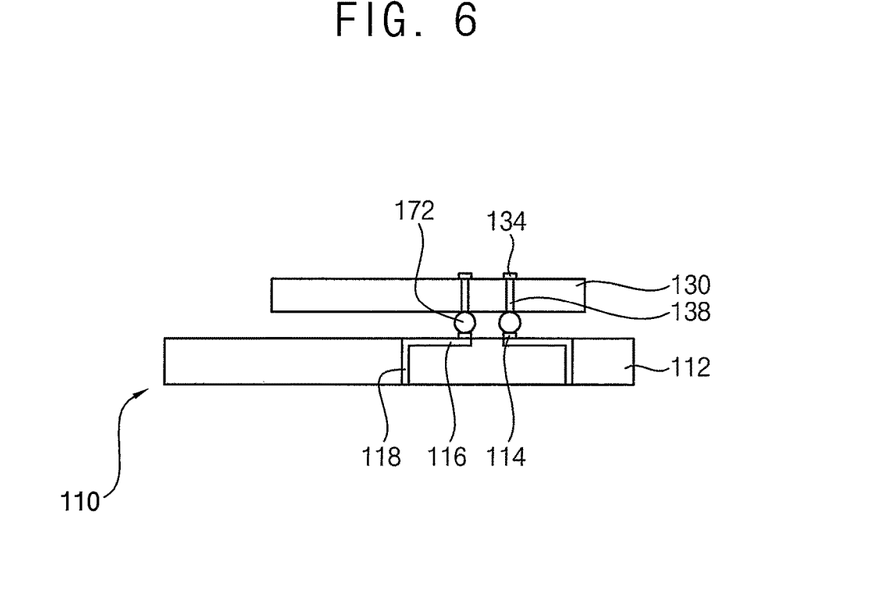
FIGS. 6, 7, 8, 9, and 10 are cross-sectional views illustrating a method of manufacturing the stack package in FIG. 1.

Referring to FIG. 6, an interposer 130 may be arranged over (e.g., above) the first substrate package 110, where the interposer 130 includes a plurality of third pads 134 that are isolated from direct contact with each other by a third pitch P3. Still referring to FIG. 6, second conductive bumps 172 may be interposed between the first substrate package 110 and the interposer 130 to electrically connect the first substrate package 110 with the interposer 130.

The second conductive bumps 172 may be formed on the upper surface of the first substrate package 110. The second conductive bumps 172 may be electrically connected to the first pads 114 of the first substrate package 110.

The interposer 130 may be arranged on the second conductive bumps 172. The third vertical signal lines 138 of the interposer 130 may be electrically connected to the second conductive bumps 172. Thus, the interposer 130 may be electrically connected with the first substrate package 110 via the second conductive bumps 172.

Figure 7:
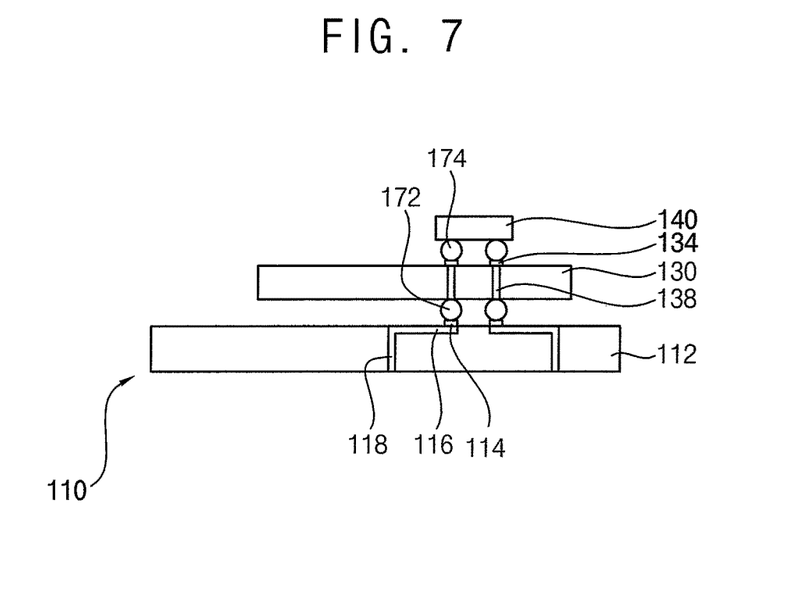

Referring to FIG. 7, at least one first semiconductor chip 140 may be arranged over (e.g., above) the interposer 130. Still referring to FIG. 7, third conductive bumps 174 may be interposed between the interposer 130 and the first semiconductor chip 140 to electrically connect the interposer 130 with the first semiconductor chip 140. The third conductive bumps 174 may be formed on the upper surface of the interposer 130. The third conductive bumps 174 may be electrically connected to the third pads 134 of the interposer 130.

The first semiconductor chip 140 may be arranged on the upper surface of the interposer 130. The first semiconductor chip 140 may be electrically connected to the third conductive bumps 174. Thus, the first semiconductor chip 140 may be electrically connected with the interposer 130 via the third conductive bumps 174.

A test signal may be applied to the first substrate package 110, the interposer 130 and the first semiconductor chip 140 to test the first substrate package 110, the interposer 130 and the first semiconductor chip 140.

Figure 8:
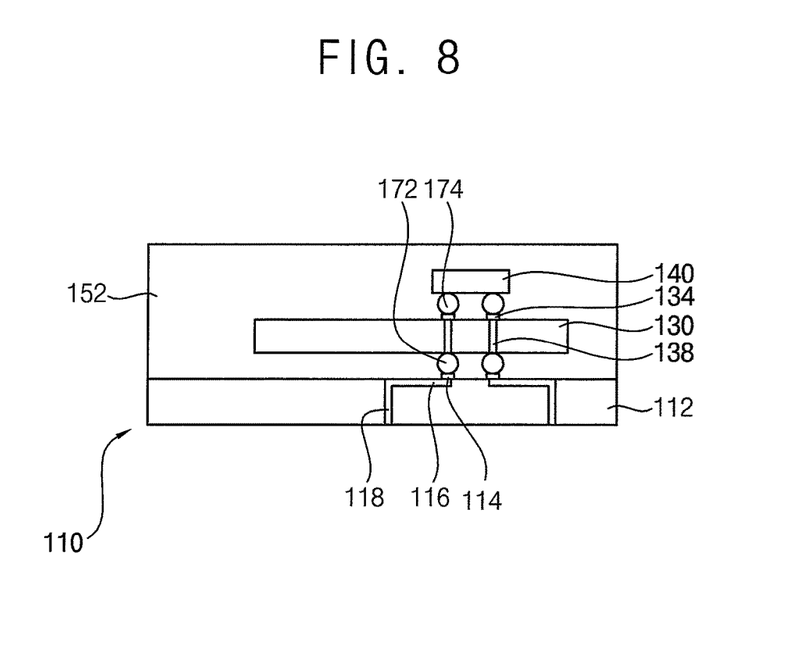

Referring to FIG. 8, the first molding member 152 may be formed on the upper surface of the first substrate package 110 to cover the interposer 130 and the first semiconductor chip 140 with the first molding member 152.

Figure 9:
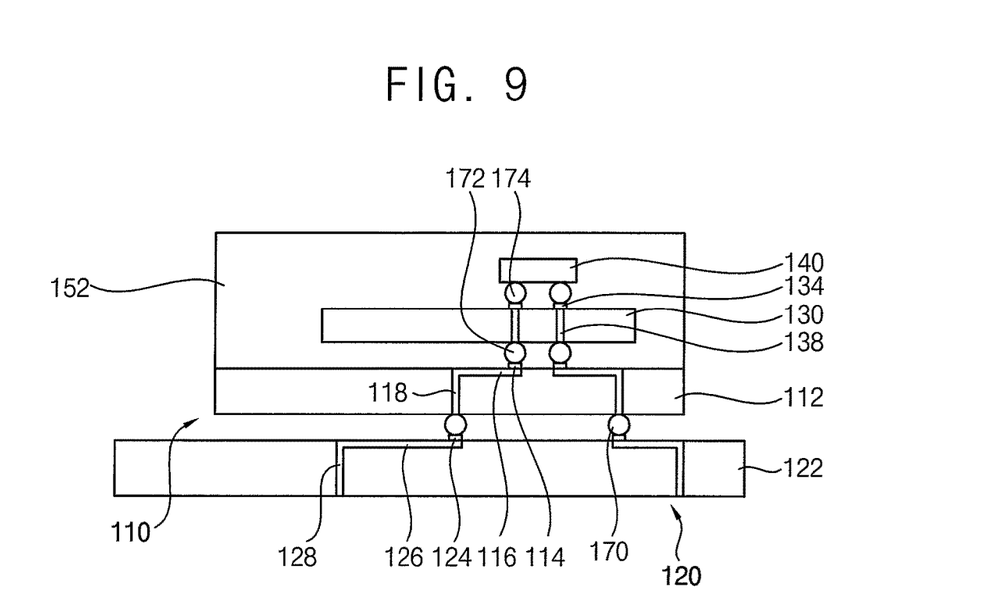

Referring to FIG. 9, the first substrate package 110 may be arranged over (e.g., above) the second substrate package 120, where the first substrate package 110 includes a plurality of first pads 114 isolated from direct contact with each other by a first pitch P1, and the second substrate package 120 includes a plurality of second pads 124 isolated from direct contact with each other by a second pitch P2 that is different from the first pitch P1. Still referring to FIG. 9, first conductive bumps 170 may be interposed between the first substrate package 110 and the second substrate package 120 to electrically connect the first substrate package 110 with the second substrate package 120. The first conductive bumps 170 may be formed on the upper surface of the second substrate package 120. The first conductive bumps 170 may be connected to the second pads 124 of the second substrate package 120.

The first substrate package 110, the interposer 130 and the first semiconductor chip 140 covered by the first molding member 152 may be arranged on the upper surface of the second substrate package 120. The first vertical signal lines 118 of the first substrate package 110 may be connected to the first conductive bumps 170. Thus, the first substrate package 110 may be electrically connected with the second substrate package 120 via the first conductive bumps 170.

A test signal may be applied to the second substrate package 120, the first substrate package 110, the interposer 130 and the first semiconductor chip 140 to test the second substrate package 120, the first substrate package 110, the interposer 130 and the first semiconductor chip 140.

Figure 10:
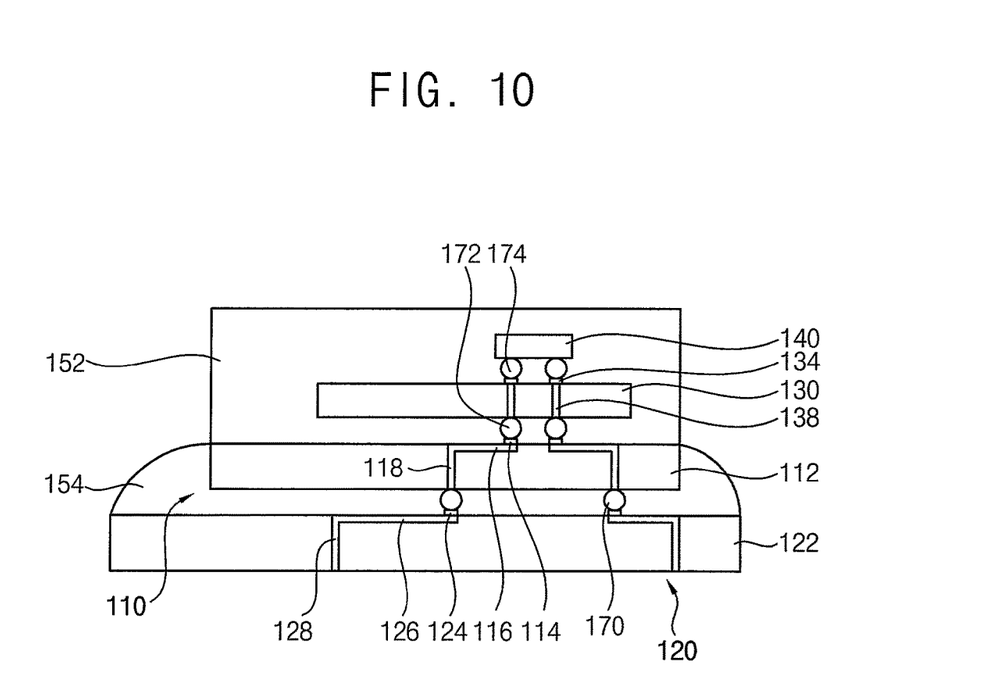

Referring to FIG. 10, the second molding member 154 may be formed on the side surfaces of the second substrate package 120 to surround the side surfaces of the second substrate package 120 with the second molding member 154. Accordingly, as shown in FIGS. 8 and 10, a method according to some example embodiments may include forming a molding member 150 on the first substrate package 110, the second substrate package 120, the interposer 130, and the first semiconductor chip 140. As shown in FIG. 8, forming the molding member 150 may include covering the first substrate package 110, the interposer 130, and the first semiconductor chip 140 with a first molding member 152. As shown in FIG. 10, forming the molding member 150 may include surrounding side surfaces of the second substrate package 120 with a second molding member 154.

The plurality of external terminals 160 may be mounted on the lower ends of the second vertical signal lines 128 of the second substrate package 120 to complete the stack package 100 in FIG. 1. Accordingly, the external terminals 160 may be mounted on a lower surface of the second substrate package 120.

Figure 11:
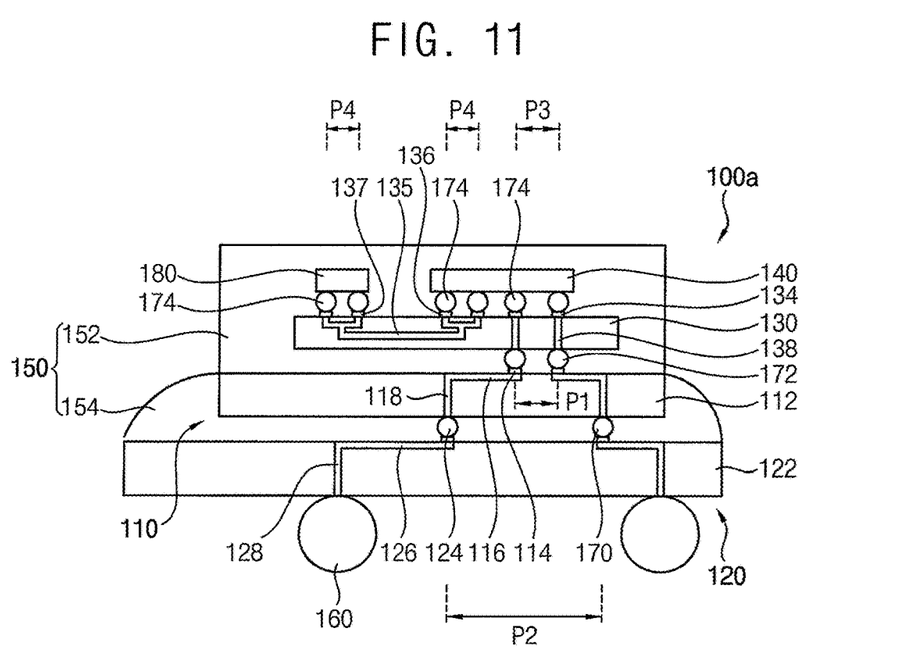
FIG. 11 is a cross-sectional view illustrating a stack package in accordance with example embodiments.
Figure 12:
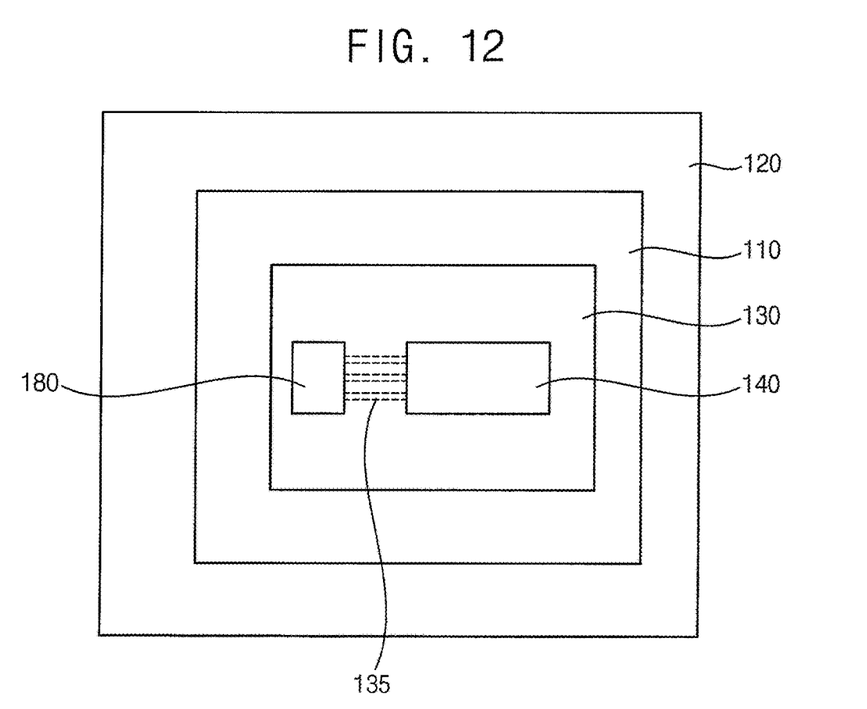
FIG. 12 is a plan view illustrating the stack package in FIG. 11.
Figure 13:
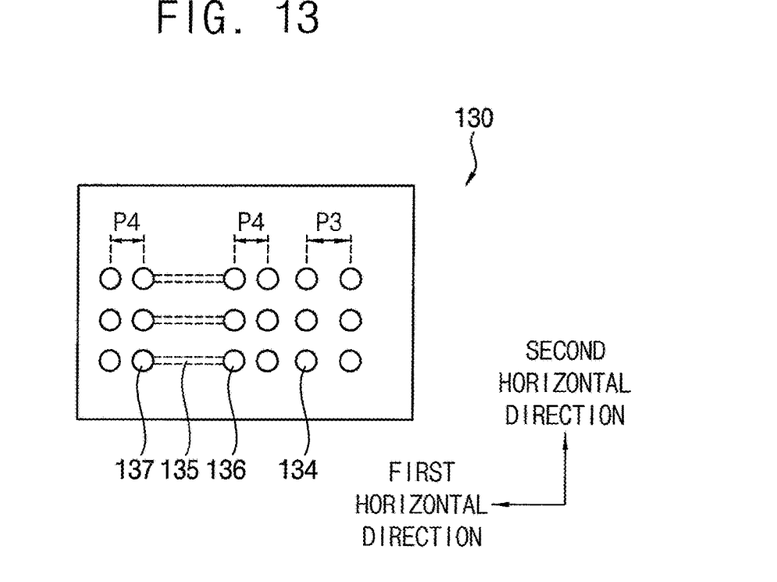
FIG. 13 is a plan view illustrating an interposer of the stack package in FIG. 12.

FIG. 11 is a cross-sectional view illustrating a stack package in accordance with example embodiments, FIG. 12 is a plan view illustrating the stack package in FIG. 11, and FIG. 13 is a plan view illustrating an interposer of the stack package in FIG. 12.

Referring to FIGS. 11 to 13, a stack package 100a of some example embodiments may include a first substrate package 110, a second substrate package 120, an interposer 130, a first semiconductor chip 140, a second semiconductor chip 180, first to third conductive bumps 170, 172 and 174, a molding member 150 and external terminals 160.

The first substrate package 110, the second substrate package 120, the first semiconductor chip 140, the first to third conductive bumps 170, 172 and 174, the molding member 150 and the external terminals 160 in FIGS. 11 to 13 may have structures and functions substantially the same as those of the first substrate package 110, the second substrate package 120, the first semiconductor chip 140, the first to third conductive bumps 170, 172 and 174, the molding member 150 and the external terminals 160 in FIG. 1, respectively. Thus, the same reference numerals may refer to the same elements and any further illustrations with respect to the first substrate package 110, the second substrate package 120, the first semiconductor chip 140, the first to third conductive bumps 170, 172 and 174, the molding member 150 and the external terminals 160 in FIGS. 11 to 13 may be omitted herein for brevity. As shown in FIG. 11, the molding member 150 may be configured to cover the first substrate package 110, the second substrate package 120, the interposer 130, the first semiconductor chip 140, and the second semiconductor chip 180. As shown in FIG. 11, the molding member 150 may include a first molding member 152 configured to cover the first substrate package 110, the interposer 130, the first semiconductor chip 140, and the second semiconductor chip 180, and a second molding member 154 configured to surround side surfaces of the second substrate package 120.

The second semiconductor chip 180 may be arranged on an upper surface of the interposer 130 such that the second semiconductor chip 180 may be understood to be above the interposer 130. In some example embodiments, the second semiconductor chip 180 may include a high bandwidth memory (HBM). The second semiconductor chip 180 may be electrically connected with the first semiconductor chip 140 via the interposer 130. In order to electrically connect the first semiconductor chip 140 with the second semiconductor chip 180, the interposer 130 may further include a pair of pluralities of fourth pads 136 and 137 and connection lines 135.

The fourth pads 136 and 137 may be arranged on the upper surface of the interposer 130. Each of the fourth pads 136 and 137 may be arranged spaced apart from each other (e.g., isolated from direct contact with each other) by a fourth pitch P4 along the first horizontal direction. A pitch between the fourth pads 136 and 137 along the second horizontal direction may be substantially the same as the fourth pitch P4 between the fourth pads 136 and 137 along the first horizontal direction. In some example embodiments, the fourth pitch P4 may be narrower than the third pitch P3. In some example embodiments, the pitch between the fourth pads 136 and 137 along the second horizontal direction may be different from the fourth pitch P4 between the fourth pads 136 and 137 along the first horizontal direction. In some example embodiments, the fourth pitch P4 may be less than about 55 μm.

The first semiconductor chip 140 may be arranged over the right fourth pads 136 adjacent to the third pads 134. The third conductive bump 174 may be interposed between the first semiconductor chip 140 and the right fourth pads 136. As shown in FIG. 11, the first semiconductor chip 140 may be electrically connected to the third pads 134 (e.g., via being connected to third conductive bumps 174 that are connected to third pads 134) and the connection lines 135 (e.g., via being connected to a first set of third conductive bumps 174 that are connected to right fourth pads 136 as shown in FIG. 11).

The second semiconductor chip 180 may be arranged over the plurality of left fourth pads 137 such that the left fourth pads 137 are electrically connected to the second semiconductor chip 180 (e.g., based on the second semiconductor chip 180 being connected to a second set of third conductive bumps 174 that are connected to the left fourth pads 137). The third conductive bump 174 may be interposed between the second semiconductor chip 180 and the left fourth pads 137.

The connection lines 135 may be formed at the interposer 130 to electrically connect separate, respective fourth pads 136 and separate, respective fourth pads 137 with each other and electrically connected to the first semiconductor chip 140. The connection lines 135 may be extended in the interposer 130. In some example embodiments, the connection lines 135 may be arranged on the upper surface of the interposer 130.

Therefore, the second semiconductor chip 180 may be electrically connected with the first semiconductor chip 140 through the third conductive bump 174, the left fourth pads 137, the connection line 135, the right fourth pads 136 and the third conductive bump 174, and thus the interposer 130 may be understood to be electrically connected with the first and second semiconductor chips 140 and 180 via the plurality of third conductive bumps 174, and the third conductive bumps 174 may be understood to electrically connect the interposer 130 with the first semiconductor chip 140 and the second semiconductor chip 180.

A method of manufacturing the stack package 100a in accordance with example embodiments may include processes substantially the same as the processes illustrated with reference to FIGS. 6 to 10 except for further including a process for forming the second semiconductor chip 180 on the upper surface of the interposer 130. Such process may include arranging at least one second semiconductor chip 180 over the interposer 130, where the second semiconductor chip 180 is electrically connected with the first semiconductor chip 140, and the second semiconductor chip 180 has a fourth pitch P4 that is narrower than the third pitch P3. Thus, any further illustrations with respect to the method may be omitted herein for brevity.

Figure 14:
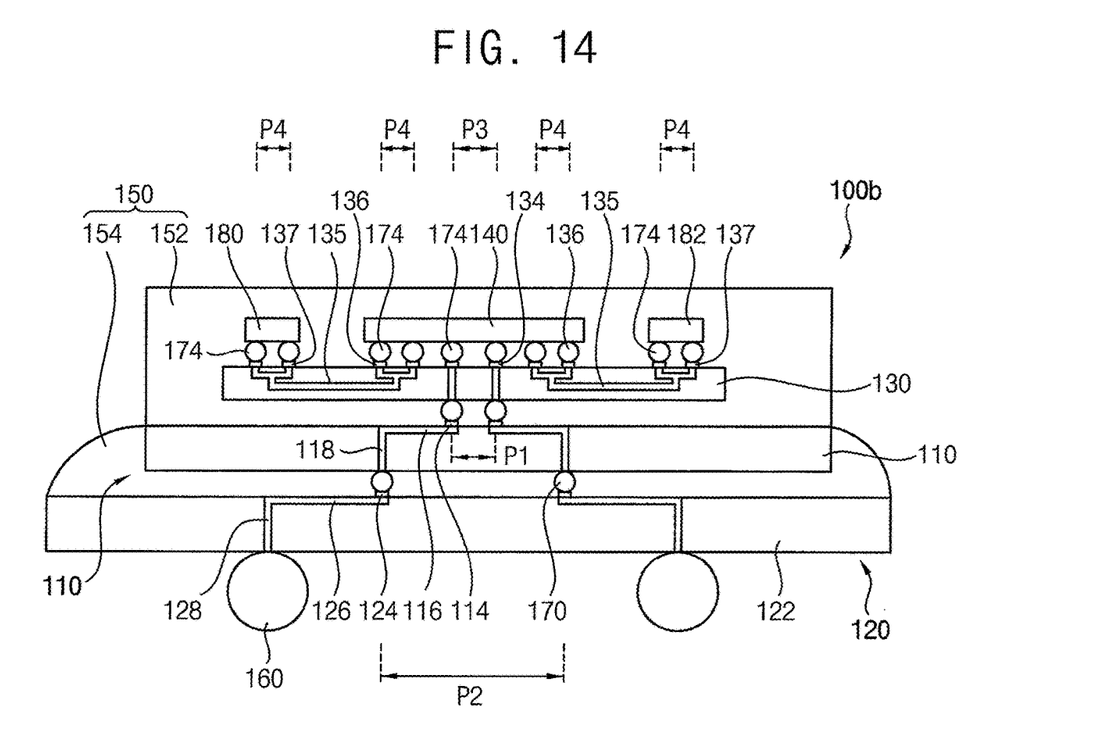
FIG. 14 is a cross-sectional view illustrating a stack package in accordance with example embodiments.
Figure 15:
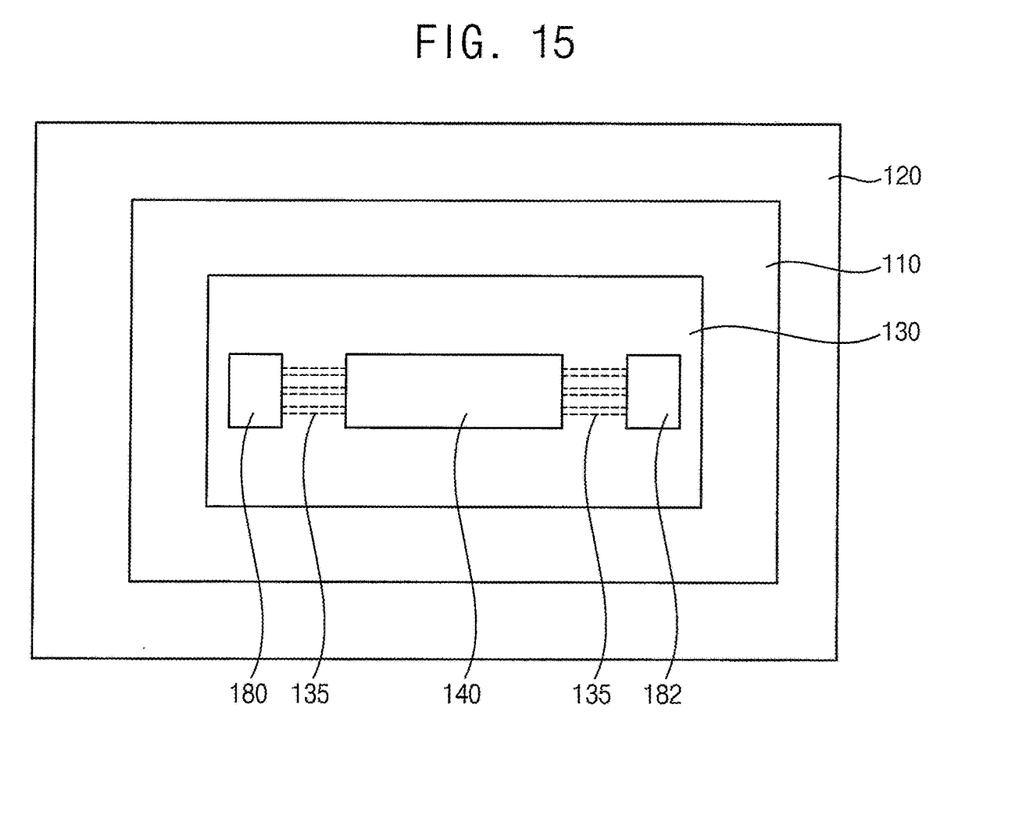
FIG. 15 is a plan view illustrating the stack package in FIG. 14.
Figure 16:
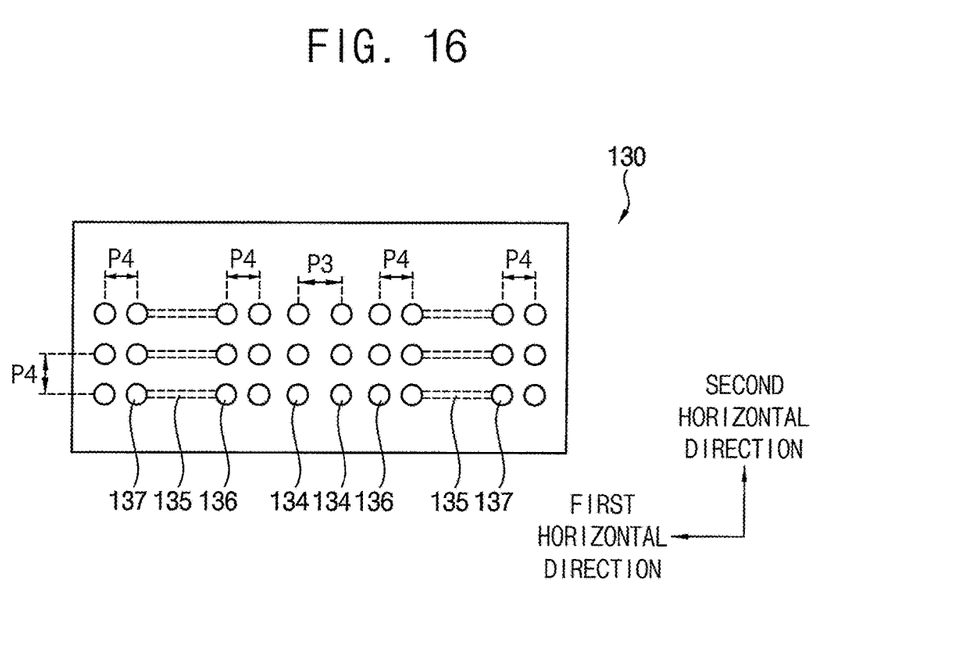
FIG. 16 is a plan view illustrating an interposer of the stack package in FIG. 15.

FIG. 14 is a cross-sectional view illustrating a stack package in accordance with example embodiments, FIG. 15 is a plan view illustrating the stack package in FIG. 14, and FIG. 16 is a plan view illustrating an interposer of the stack package in FIG. 15.

A stack package 100b of some example embodiments may include elements substantially the same as those of the stack package 100a in FIG. 11 except for including two second semiconductor chips. Thus, the same reference numerals may refer to the same elements and any further illustrations with respect to the same elements may be omitted herein for brevity.

Referring to FIGS. 14 to 16, the two second semiconductor chips 180 and 182 may be arranged on the upper surface of the interposer 130. The second semiconductor chips 180 and 182 may be arranged at both sides of the first semiconductor chip 140.

Therefore, the fourth pads 136 and 137 may be arranged on portions of the upper surface of the interposer 130 under both edge portions of the first semiconductor chip 140. The second semiconductor chips 180 and 182 may be electrically connected with the first semiconductor chip 140 via the connection lines 135.

Figure 17:
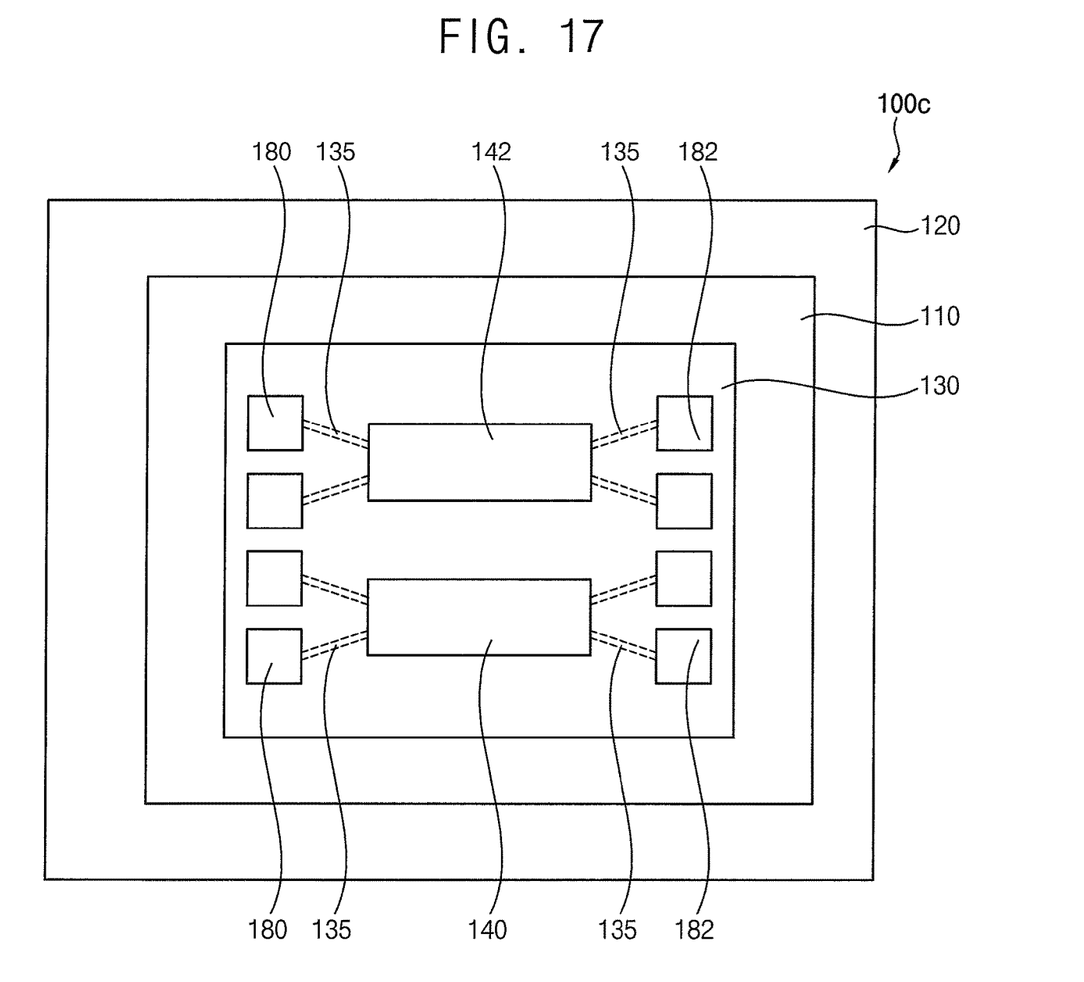
FIG. 17 is a cross-sectional view illustrating a stack package in accordance with example embodiments.
Figure 18:
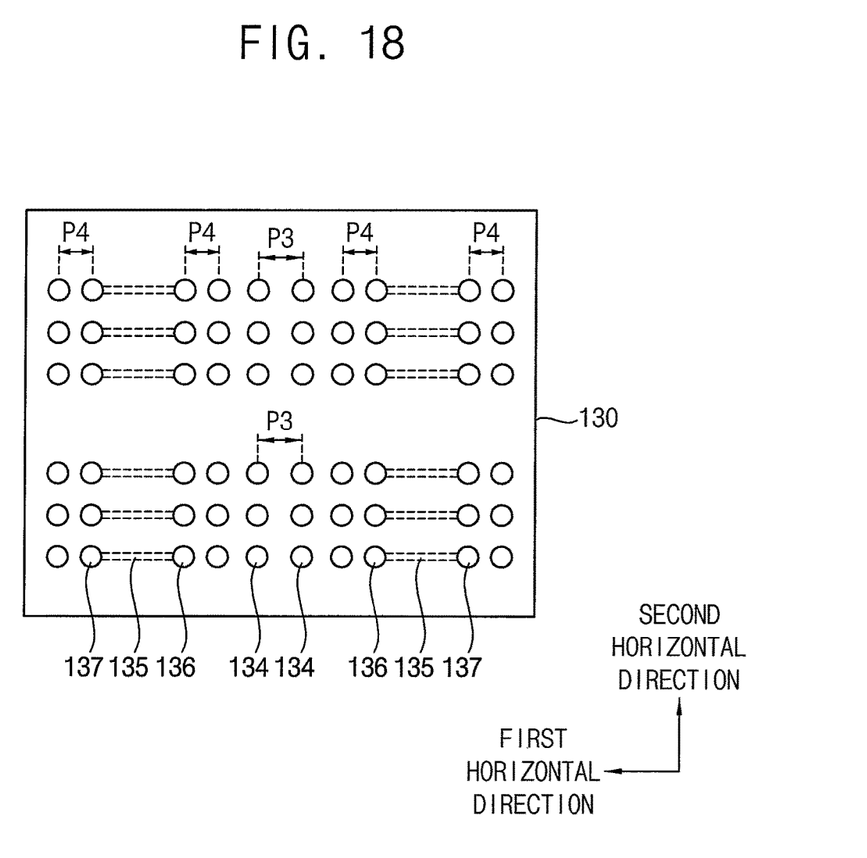
FIG. 18 is a plan view illustrating an interposer of the stack package in FIG. 17.

FIG. 17 is a cross-sectional view illustrating a stack package in accordance with example embodiments, and FIG. 18 is a plan view illustrating an interposer of the stack package in FIG. 17.

A stack package 100c of some example embodiments may include elements substantially the same as those of the stack package 100b in FIG. 14 except for including two first semiconductor chips and eight second semiconductor chips. Thus, the same reference numerals may refer to the same elements and any further illustrations with respect to the same elements may be omitted herein for brevity.

Referring to FIGS. 17 and 18, the two first semiconductor chips 140 and 142 may be arranged on a central portion of the upper surface of the interposer 130. The eight second semiconductor chips 180 and 182 may be arranged on an edge portion of the upper surface of the interposer 130.

Therefore, the second semiconductor chip 180 and 182 may be positioned at both sides of the first semiconductor chip 140 and 142. The four second semiconductor chip 180 and 182 may be electrically connected with the first semiconductor chips 140 and 142, respectively. The second semiconductor chip 180 and 182 may be electrically connected with the first semiconductor chip 140 and 142 via the connection lines 135.

Figure 19:
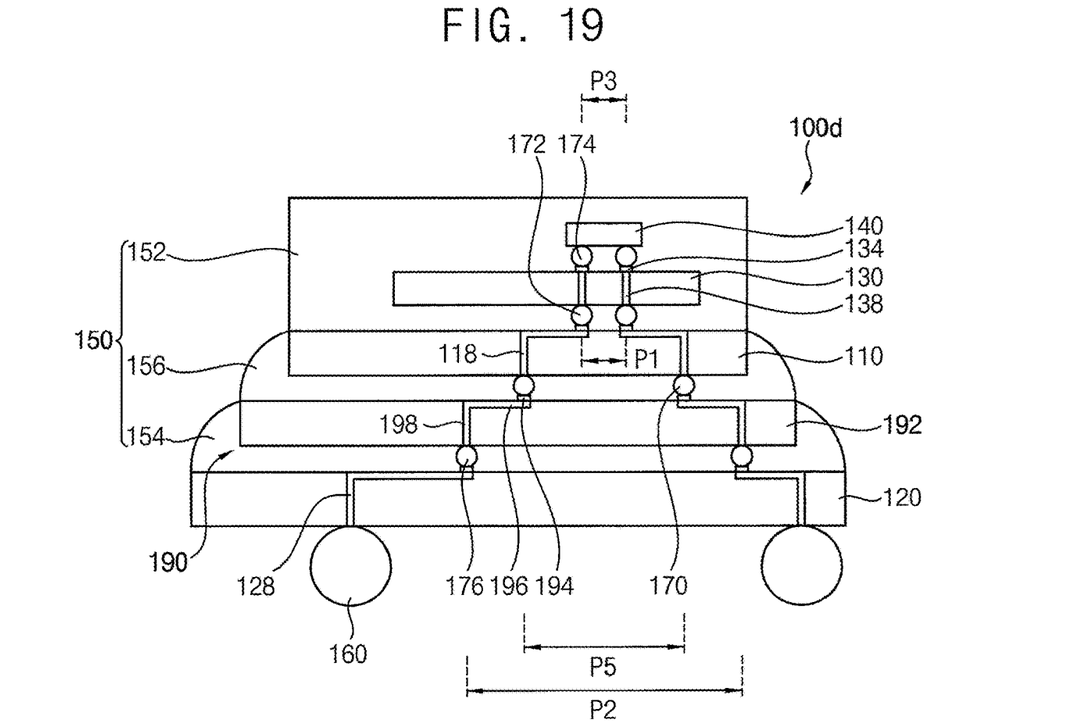
FIG. 19 is a cross-sectional view illustrating a stack package in accordance with example embodiments.
Figure 20:
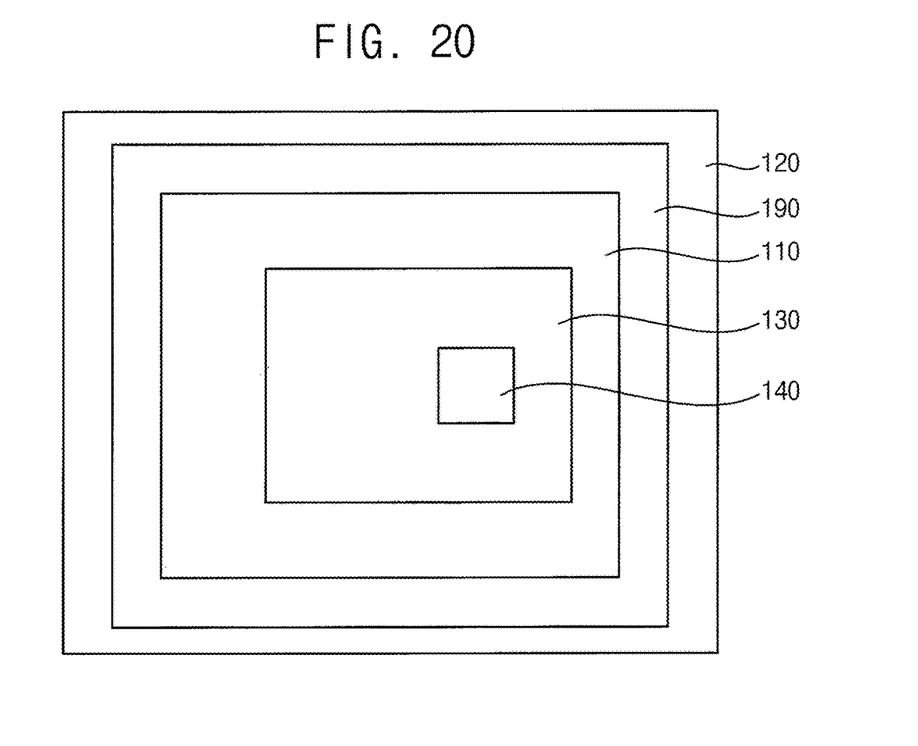
FIG. 20 is a plan view illustrating the stack package in FIG. 19.

FIG. 19 is a cross-sectional view illustrating a stack package in accordance with example embodiments, and FIG. 20 is a plan view illustrating the stack package in FIG. 19.

A stack package 100d of some example embodiments may include elements substantially the same as those of the stack package 100 in FIG. 1 except for further including a third substrate package. Thus, the same reference numerals may refer to the same elements and any further illustrations with respect to the same elements may be omitted herein for brevity.

Referring to FIGS. 19 and 20, the third substrate package 190 may be interposed between the first substrate package 110 and the second substrate package 120. In some example embodiments, the third substrate package 190 may include an ABF package or an HDI package. The third substrate package 190 may function as to improve characteristics of the stack package 100d and to reduce routing complexity of signal lines.

The first conductive bumps 170 may be interposed between the third substrate package 190 and the first substrate package 110 to electrically connect the third substrate package 190 with the first substrate package 110. The fourth conductive bumps 176 may be interposed between the third substrate package 190 and the second substrate package 120 to electrically connect the third substrate package 190 with the second substrate package 120.

The third substrate package 190 may include a third insulation substrate 192, a plurality of fifth pads 194, a plurality of third horizontal signal lines 196 and a plurality of third vertical signal lines 198.

The plurality of fifth pads 194 may be arranged on an upper surface of the third insulation substrate 192. The first conductive bumps 170 may be connected to the fifth pads 194. The fifth pads 194 may be arranged spaced apart from each other (e.g., isolated from direct contact with each other) by a fifth pitch P5 along the first horizontal direction. The fifth pitch P5 may be different from the first pitch P1. The fifth pitch P5 may be wider than the first pitch P1 and narrower than the second pitch P2. A pitch between the fifth pads 194 along the second horizontal direction may be substantially the same as the fifth pitch P5 between the fifth pads 194 along the first horizontal direction. In some example embodiments, the pitch between the fifth pads 194 along the second horizontal direction may be different from the fifth pitch P5 between the fifth pads 194 along the first horizontal direction. In some example embodiments, the fifth pitch P5 is about 150 μm to about 400 μm.

The third horizontal signal lines 196 may be extended from separate, respective fifth pads 194 on the upper surface of the third insulation substrate 192. The third vertical signal lines 198 may be extended from ends of separate, respective third horizontal signal lines to a lower surface of the third insulation substrate 192 vertically through the third insulation substrate 192. The third vertical signal lines 198 may include lower ends exposed through the lower surface of the third insulation substrate 192. The fourth conductive bumps 176 may be connected to the exposed lower ends of the third vertical signal lines 198.

The molding member 150 may be configured to cover the second substrate package 120, the third substrate package 190, the first substrate package 110, the interposer 130 and the first semiconductor chip 140. The molding member 150 may include a first molding member 152, a second molding member 154 and a third molding member 156. The first molding member 152 may be configured to cover the first substrate package 110, the interposer 130 and the first semiconductor chip 140. The second molding member 154 may be configured to surround the side surfaces of the second substrate package 120. The third molding member 156 may be configured to surround side surfaces of the third substrate package 190. The molding member 150 may include an EMC.

In some example embodiments, the stack package 100*d* of some example embodiments may include at least two first semiconductor chips and/or at least one second semiconductor chip.

A method of manufacturing the stack package 100*d* in accordance with example embodiments may include processes substantially the same as the processes illustrated with reference to FIGS. 6 to 10 except for further including a process for forming the third substrate package 190. Such process may include forming a third substrate package 190 between the first substrate package 110 and the second substrate package 120, the third substrate package 190 including a plurality of fifth pads 194 isolated from direct contact with each other by a fifth pitch P5 that is different from the first pitch P1. Such process may further include interposing a plurality of fourth conductive bumps 176 between the second substrate package 120 and the third substrate package 190 to electrically connect the second substrate package 120 with the third substrate package 190. Thus, any further illustrations with respect to the method may be omitted herein for brevity.

The stack packages of some example embodiments may be applied to network devices, artificial intelligence (AI) devices, etc. However, the stack packages of some example embodiments may also be applied to other devices as well as the network devices, the AI devices, etc.

According to some example embodiments, the stack package may include the HDI package, the ABF package, the interposer and the ASIC having the different pitches to reduce a cost for manufacturing the stack package having a large area.

Further, the ABF package and the interposer may have the substantially the same pitch. Thus, the ABF package and the interposer may be electrically connected with each other only through the vertical signal line in the interposer. Therefore, it may not be required to form a horizontal signal line in the interposer. As a result, a resistance increase caused by the horizontal signal line may be reduced or prevented so that the stack package may have improved performance.

The foregoing is illustrative of some example embodiments and is not to be construed as limiting thereof. Although some example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A stack package, comprising:
   a first substrate package including a plurality of first pads isolated from direct contact with each other by a first pitch;
   a second substrate package under the first substrate package, the second substrate package including a plurality of second pads isolated from direct contact with each other by a second pitch, the second pitch being different from the first pitch;
   an interposer above the first substrate package such that the first substrate package is between the interposer and the second substrate package, the interposer including a plurality of third pads isolated from direct contact with each other by a third pitch; and
   at least one first semiconductor chip above the interposer.

2. The stack package of claim 1, wherein the first pitch is narrower than the second pitch.

3. The stack package of claim 1, wherein the first pitch is substantially the same as the third pitch.

4. The stack package of claim 1, wherein an area of the first substrate package is smaller than an area of the second substrate package and greater than an area of the interposer.

5. The stack package of claim 1, wherein the first substrate package comprises:
   a first insulation substrate, wherein the plurality of first pads are on an upper surface of the first insulation substrate;
   a plurality of first horizontal signal lines extended from separate, respective first pads of the plurality of first pads on the upper surface of the first insulation substrate; and
   a plurality of first vertical signal lines extended from separate, respective first horizontal signal lines of the plurality of first horizontal signal lines to a lower surface of the first insulation substrate vertically through the first insulation substrate.

6. The stack package of claim 1, wherein the second substrate package comprises:
   a second insulation substrate, wherein the plurality of second pads are on an upper surface of the second insulation substrate;

a plurality of second horizontal signal lines extended from separate, respective second pads of the plurality of second pads on the upper surface of the second insulation substrate; and a plurality of second vertical signal lines extended from separate, respective second horizontal signal lines of the plurality of second horizontal signal lines to a lower surface of the second insulation substrate vertically through the second insulation substrate.

7. The stack package of claim 1, wherein the interposer comprises a plurality of third vertical signal lines extended from separate, respective third pads of the plurality of third pads to a lower surface of the interposer vertically through the interposer.

8. The stack package of claim 1, further comprising:
a plurality of first conductive bumps between the first substrate package and the second substrate package to electrically connect the first substrate package with the second substrate package;
a plurality of second conductive bumps between the first substrate package and the interposer to electrically connect the first substrate package with the interposer; and
a plurality of third conductive bumps between the interposer and the first semiconductor chip to electrically connect the interposer with the first semiconductor chip.

9. The stack package of claim 8, wherein the plurality of second conductive bumps each have a size of no more than a size of an individual first conductive bump of the plurality of first conductive bumps and larger than a size of an individual third conductive bump of the plurality of third conductive bumps.

10. The stack package of claim 1, further comprising at least one second semiconductor chip above the interposer.

11. The stack package of claim 10, wherein the interposer further comprises a plurality of fourth pads isolated from direct contact with each other by a fourth pitch and electrically connected to the second semiconductor chip.

12. The stack package of claim 11, wherein the interposer further comprises a connection line extended from separate, respective fourth pads of the plurality of fourth pads and connected to the first semiconductor chip.

13. The stack package of claim 12, wherein the connection line is extended in the interposer.

14. The stack package of claim 11, wherein the fourth pitch is narrower than the third pitch.

15. The stack package of claim 1, further comprising:
a third substrate package between the first substrate package and the second substrate package, the third substrate package including a plurality of fifth pads isolated from direct contact with each other by a fifth pitch.

16. The stack package of claim 15, wherein the fifth pitch is wider than the first pitch and narrower than the second pitch.

17. The stack package of claim 15, wherein the third substrate package comprises:
a third insulation substrate, wherein the plurality of fifth pads are on an upper surface of the third insulation substrate;
a plurality of third horizontal signal lines extended from separate, respective fifth pads of the plurality of fifth pads on the upper surface of the third insulation substrate; and
a plurality of third vertical signal lines extended from separate, respective third horizontal signal lines of the plurality of third horizontal signal lines to a lower surface of the third insulation substrate vertically through the third insulation substrate.

18. The stack package of claim 15, further comprising:
a plurality of fourth conductive bumps between the second substrate package and the third substrate package to electrically connect the second substrate package with the third substrate package.

19. A stack package, comprising:
an Ajinomoto build-up film (ABF) package including a plurality of first pads isolated from direct contact with each other by a first pitch, wherein the first pitch is about 55 μm to about 150 μm;
a high density interconnection (HDI) package under the ABF package, the HDI package including a plurality of second pads isolated from direct contact with each other by a second pitch, wherein the second pitch is about 400 μm to about 600 μm, wherein an area of the HDI package is larger than an area of the ABF package;
a plurality of first conductive bumps between the ABF package and the HDI package to electrically connect the plurality of second pads with the ABF package;
an interposer above the ABF package, the interposer including a plurality of third pads isolated from direct contact with each other by a third pitch, wherein the third pitch is about 55 μm to about 150 μm, the interposer further including a plurality of vertical signal lines downwardly extended from separate, respective third pads of the plurality of third pads, a plurality of fourth pads isolated from direct contact with each other by a fourth pitch, the fourth pitch being less than about 55 μm, the interposer further including a plurality of connection lines extended from separate, respective fourth pads of the plurality of fourth pads, wherein an area of the interposer is smaller than the area of the ABF package;
a plurality of second conductive bumps between the ABF package and the interposer to electrically connect the plurality of first pads with the plurality of vertical signal lines;
at least one application specific integrated circuit (ASIC) above the interposer and electrically connected to the plurality of third pads and the plurality of connection lines;
at least one high bandwidth memory (HBM) above the interposer and electrically connected to the plurality of fourth pads;
a plurality of third conductive bumps between the interposer and the ASIC and the HBM to electrically connect the interposer with the ASIC and the HBM; and
a molding member configured to cover the ABF package, the HDI package, the interposer, the ASIC and the HBM.

20. The stack package of claim 19, further comprising:
a second ABF package between the ABF package and the HDI package, the second ABF package including a plurality of fifth pads isolated from direct contact with each other by a fifth pitch, the fifth pitch being about 150 μm to about 400 μm; and
a plurality of fourth conductive bumps between the HDI package and the second ABF package to electrically connect the HDI package with the second ABF package.

* * * * *